United States Patent
Wei et al.

(10) Patent No.: US 12,284,813 B2
(45) Date of Patent: Apr. 22, 2025

(54) NONVOLATILE MEMORY DEVICE INCLUDING DUAL MEMORY LAYERS

(71) Applicant: Avalanche Technology, Inc., Fremont, CA (US)

(72) Inventors: Zhiqiang Wei, Pleasanton, CA (US); Zihui Wang, Mountain View, CA (US); Ebrahim Abedifard, San Jose, CA (US); Yiming Huai, Pleasanton, CA (US)

(73) Assignee: Avalanche Technology, Inc., Fremont, CA (US)

( * ) Notice: Subject to any disclaimer, the term of this patent is extended or adjusted under 35 U.S.C. 154(b) by 276 days.

(21) Appl. No.: 18/106,159

(22) Filed: Feb. 6, 2023

(65) Prior Publication Data
US 2024/0268125 A1    Aug. 8, 2024

(51) Int. Cl.
*H10B 61/00*    (2023.01)
*H01L 23/528*    (2006.01)
*H10N 50/10*    (2023.01)

(52) U.S. Cl.
CPC ......... *H10B 61/22* (2023.02); *H01L 23/5283* (2013.01); *H10N 50/10* (2023.02)

(58) Field of Classification Search
CPC ..... H10B 61/22; H10N 50/10; H01L 23/5283
USPC ....................................................... 257/421
See application file for complete search history.

(56) References Cited

U.S. PATENT DOCUMENTS

| | | | |
|---|---|---|---|
| 5,838,036 A | 11/1998 | Mori | |
| 7,326,993 B2 | 2/2008 | Kajimoto et al. | |
| 8,184,471 B2 | 5/2012 | Woo et al. | |
| 8,665,629 B2 | 3/2014 | Park et al. | |
| 9,123,575 B1 | 9/2015 | Satoh et al. | |
| 9,548,448 B1 | 1/2017 | Satoh et al. | |
| 10,043,852 B2 | 8/2018 | Kanaya | |
| 2017/0033158 A1* | 2/2017 | Vereen | H10N 70/021 |
| 2018/0068710 A1* | 3/2018 | Funane | H10B 10/12 |
| 2018/0211710 A1* | 7/2018 | Saito | H10B 41/35 |
| 2020/0185374 A1* | 6/2020 | Gupta | H10N 50/01 |

* cited by examiner

*Primary Examiner* — Jami Valentine Miller
(74) *Attorney, Agent, or Firm* — Bing K. Yen

(57) ABSTRACT

The present invention is directed to a nonvolatile memory device including a plurality of first conductive lines extending along a first direction; first and second plurality of second conductive lines extending along a second direction; an array of active regions, each active region having an elongated shape directed along a third direction substantially bisecting an angle formed between the first and second directions and including first and second drains formed at opposite ends thereof; and an array of first memory elements and an array of second memory elements formed at different levels, each first memory element and each second memory element being electrically connected to a respective first drain and a respective second drain, respectively. The first and second plurality of second conductive lines are electrically connected to the array of first memory elements and the array of second memory elements along the second direction, respectively.

10 Claims, 5 Drawing Sheets

NONVOLATILE MEMORY DEVICE INCLUDING DUAL MEMORY LAYERS

BACKGROUND

The present invention relates to a nonvolatile memory device, and more particularly, to embodiments of a memory structure that can increase the separation spacing between closest adjacent memory elements for a given memory cell size.

A memory device normally comprises an array of memory cells, each of which includes a memory element and a selection transistor coupled in series between two electrodes. The selection transistor functions like a switch to direct current or voltage through the selected memory element coupled thereto. Upon application of an appropriate voltage or current to the memory element, the electrical property of the memory element would change accordingly, thereby switching the stored logic in the respective memory cell.

A memory device may be either volatile or nonvolatile, depending on the types of memory element and memory architecture used. An example of volatile memory devices is dynamic random access memory (DRAM), which loses its stored information when power is interrupted or lost. Nonvolatile memory devices, such as magnetic random access memory (MRAM) or other types of resistance-based memory devices, can retain stored information when powered off.

A resistance-based memory device normally comprises an array of memory cells, each of which includes a memory element and a selection transistor coupled in series between two electrodes. The selection transistor functions like a switch to direct current or voltage through the selected memory element coupled thereto. Upon application of an appropriate voltage or current to the selected memory element, the electrical property of the memory element would change accordingly, thereby switching the stored logic in the respective memory cell.

A resistance-based memory element may be classified into at least one of several known groups based on their resistance switching mechanism. The memory element of Phase Change Random Access Memory (PCRAM) may comprise a phase change chalcogenide compound, which can switch between a resistive phase (amorphous or crystalline) and a conductive crystalline phase. The memory element of Conductive Bridging Random Access Memory (CBRAM) relies on the statistical bridging of metal rich precipitates therein for its switching mechanism. The memory element of CBRAM normally comprises a nominally insulating metal oxide material, which can switch to a lower electrical resistance state as the metal rich precipitates grow and link to form conductive paths upon application of an appropriate voltage. The memory element of Magnetic Random Access Memory (MRAM) typically comprises at least two layers of ferromagnetic materials with an insulating tunnel junction layer interposed therebetween. When a switching current is applied to the memory element of an MRAM device, one of the ferromagnetic layers will switch its magnetization direction with respect to that of the other magnetic layer, thereby changing the electrical resistance of the element.

A magnetic memory element normally includes a magnetic reference layer and a magnetic free layer with an electron tunnel junction layer interposed therebetween. The magnetic reference layer, the electron tunnel junction layer, and the magnetic free layer collectively form a magnetic tunneling junction (MTJ). Upon the application of an appropriate current through the MTJ, the magnetization direction of the magnetic free layer can be switched between two directions: parallel and anti-parallel with respect to the magnetization direction of the magnetic reference layer. The electron tunnel junction layer is normally made of an insulating material with a thickness ranging from a few to a few tens of angstroms. When the magnetization directions of the magnetic free and reference layers are substantially parallel or oriented in a same direction, electrons polarized by the magnetic reference layer can tunnel through the insulating tunnel junction layer, thereby decreasing the electrical resistance of the MTJ. Conversely, the electrical resistance of the MTJ is high when the magnetization directions of the magnetic reference and free layers are substantially anti-parallel or oriented in opposite directions. The stored logic in the magnetic memory element can be switched by changing the magnetization direction of the magnetic free layer between parallel and anti-parallel with respect to the magnetization direction of the reference layer. Therefore, the MTJ has two stable resistance states that allow the MTJ to serve as a non-volatile memory element.

To be cost competitive, a small memory cell size is desired in order to increase device density on wafers. One way to achieve this is to simply shrink the minimum feature size, F, normally associated with a particular manufacturing process. Another approach to reduce the memory cell size is to use a compact cell structure. Recent advances in semiconductor processing, such as implementation of oblique active region, may produce a memory device with compact cell size. For example, FIG. 1 is a top view an array of 9 $F^2$ memory cells for a memory device. The memory device includes a semiconductor substrate 50 and a plurality of active regions 52 separately formed therein. The active regions 52 have an elongated shape extending along the x-direction and are arranged in a staggered pattern. Each active region 52 has two drains 54 formed at two end portions thereof and a common source 56 disposed at the central portion thereof. A memory element 58 is formed above each drain 54 and is electrically connected thereto. In the cell layout shown in FIG. 1, the center-to-center spacing between two closest neighbors of the memory elements 58 is either 4 F or 2√2 F because the memory elements 58 are not uniformly arranged. For some types of memory elements, such as MTJ that requires ion milling, the smaller center-to-center distance may severely affect the fabrication process. Therefore, it is desirable to increase the minimum spacing between two adjacent memory elements to increase the gap therebetween for easing processing constraints and/or to increase the memory size for improved memory performance.

For the foregoing reasons, there is a need for a memory device that has a relaxed center-to-center spacing between adjacent memory elements and that can be inexpensively manufactured.

SUMMARY

The present invention is directed to a memory device that satisfies this need. A nonvolatile memory device having features of the present invention includes a plurality of first conductive lines extending along a first direction; first and second plurality of second conductive lines extending along a second direction; an array of active regions, each active region having an elongated shape directed along a third direction substantially bisecting an angle formed between the first and second directions and including first and second drains formed at opposite ends thereof; and an array of first memory elements and an array of second memory elements formed at different levels, each first memory element and each second memory element being electrically connected to a respective first drain and a respective second drain, respectively. The first and second plurality of second conductive lines are electrically connected to the array of first memory elements and the array of second memory elements along the second direction, respectively.

According to another aspect of the present invention, a nonvolatile memory device includes a plurality of transistor pairs arranged in a rectangular array, each transistor pair including one of a plurality of first transistors and one of a plurality of second transistors that respectively include first and second drains and share one of a plurality of common sources; an array of first memory elements and an array of second memory elements formed at different levels, each first memory element and each second memory element being electrically connected to a respective first drain and a respective second drain, respectively; a first plurality of first conductive lines extending along a first direction and configured to control current flow in the plurality of first transistors; a second plurality of first conductive lines extending along the first direction and configured to control current flow in the plurality of second transistors; a plurality of second conductive lines electrically connected to the array of first memory elements and the array of second memory elements along a second direction substantially perpendicular to the first direction; and a plurality of third conductive lines electrically connected to the plurality of common sources along the first direction.

BRIEF DESCRIPTION OF THE DRAWINGS

These and other features, aspects, and advantages of the present invention will become better understood with regard to the following description, appended claims, and accompanying drawings where:

DETAILED DESCRIPTION

Figure 1:
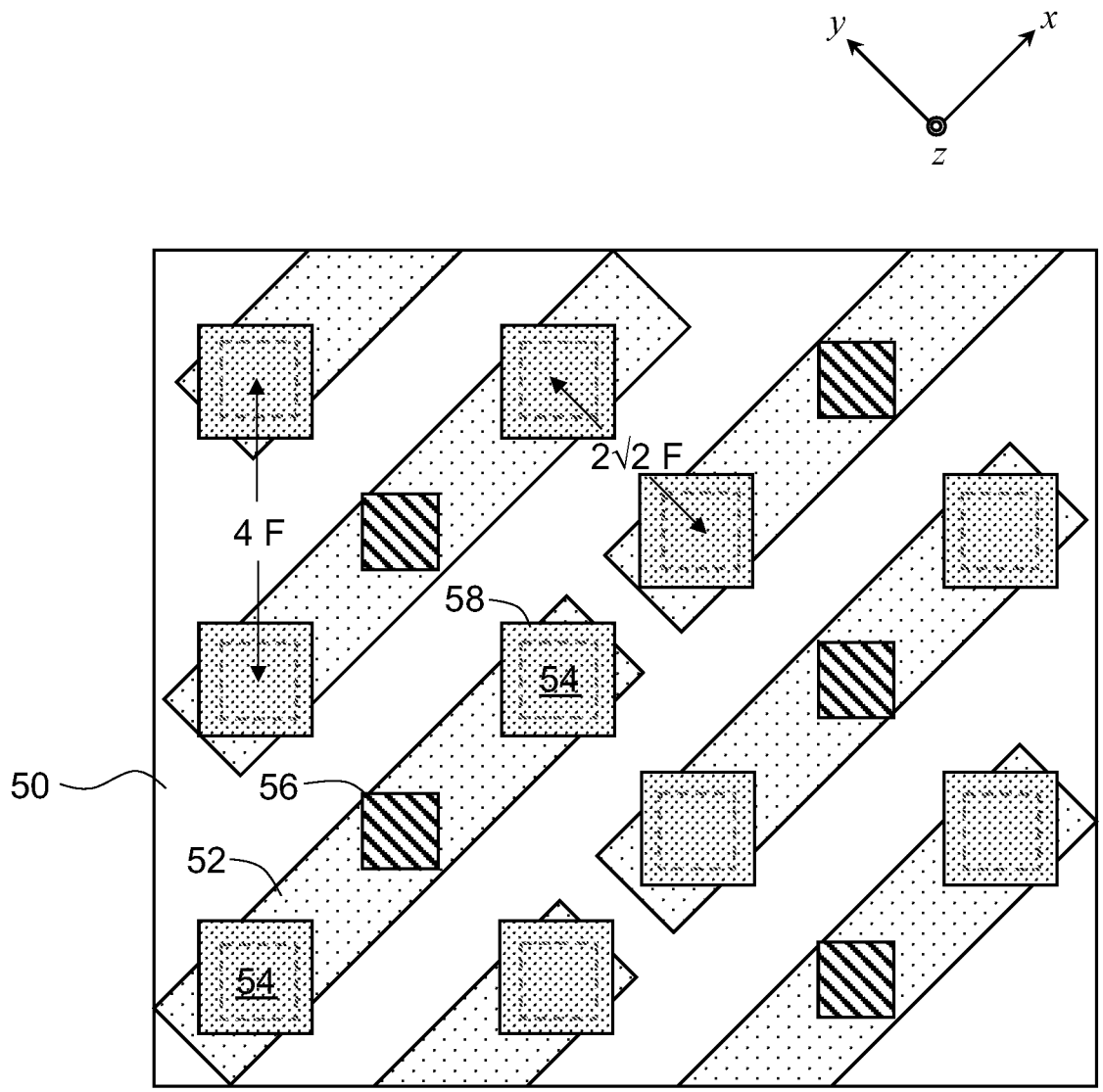
FIG. 1 is a top view of a nonvolatile memory device including a plurality of active regions separately formed in a substrate.

Where reference is made herein to a material AB composed of element A and element B, the material AB can be an alloy, a compound, or a combination thereof, except where the context excludes that possibility.

An embodiment of the present invention as applied to a memory device having a relaxed center-to-center distance between the memory elements will now be described with reference to FIG. 2. In this top-view drawing, the substrate and vias/contacts connecting separate elements in the vertical direction are omitted for reasons of clarity. The nonvolatile semiconductor memory device 100 includes a plurality of first conductive lines 102 extending along a first direction; a first plurality of second conductive lines 104 and a second plurality of second conductive lines 106 extending along a second direction; an array of active regions 108 separately formed in a substrate, each active region 108 having an elongated shape directed or aligned along a third direction substantially bisecting an angle formed between the first and second directions, each active region 108 including a first drain 110 and a second drain 112 formed at opposite ends thereof and a common source 114 formed therebetween; an array of first memory elements 116 and an array of second memory elements 118 formed at different levels above the active regions 108, each first memory element 116 and each second memory element 118 being electrically connected to a respective first drain 110 and a respective second drain 112, respectively.

Figure 2:
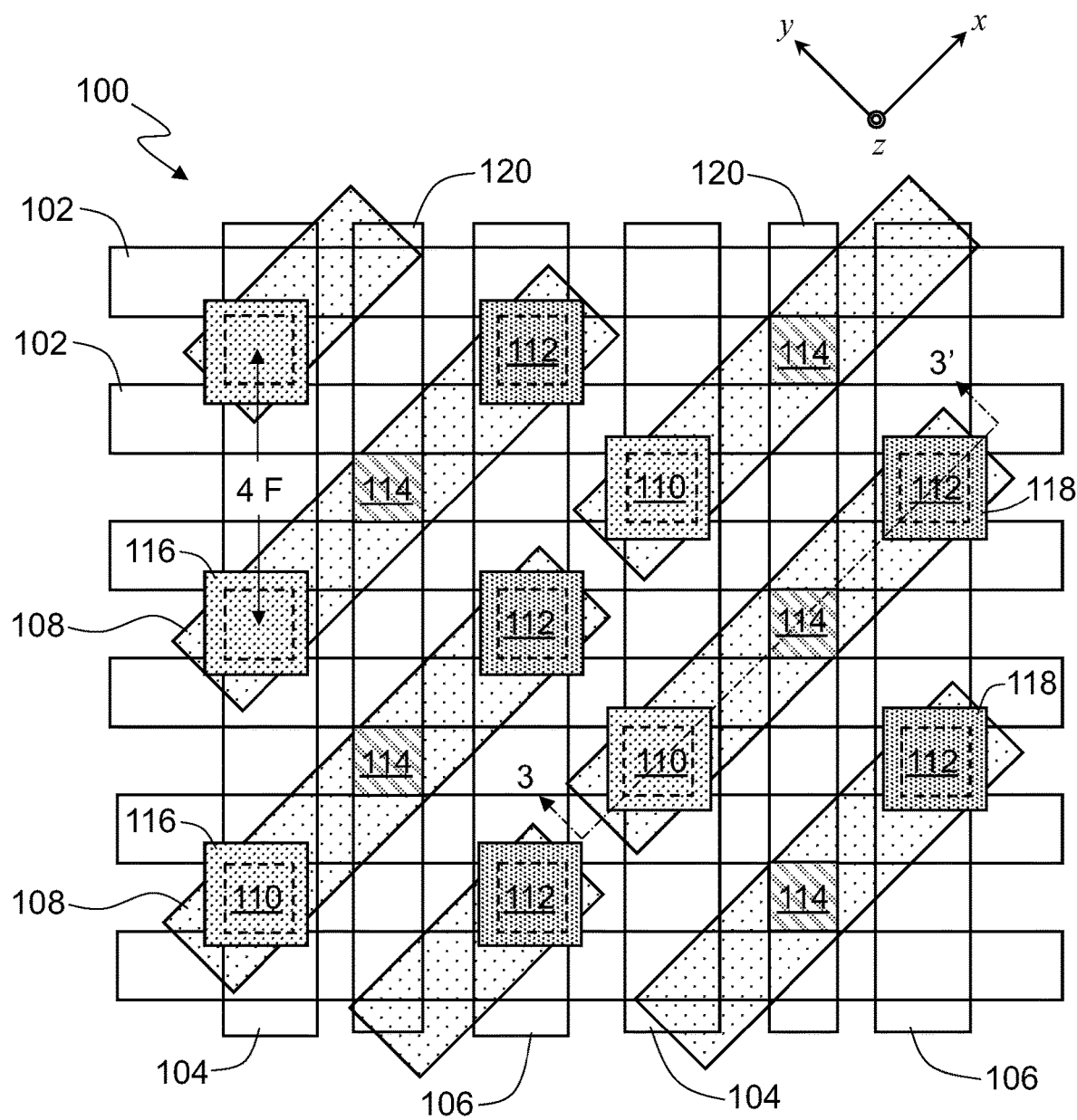
FIG. 2 is a top view of a nonvolatile memory device including two layers of memory elements in accordance with an embodiment of the present invention.

With continued reference to FIG. 2, the plurality of first conductive lines 102 cross the array of active regions 108 in the first direction and are configured to control current flows between the common source 114 and the drains 110 and 112. The first plurality of second conductive lines 104 are electrically connected to the plurality of first memory elements 116 along the second direction. The second plurality of second conductive lines 106 are electrically connected to the plurality of second memory elements 118 along the second direction. The nonvolatile memory device 100 may further include a plurality of third conductive lines 120 electrically connected to the common sources 114 along the second direction. In an embodiment, the first and second directions are substantially perpendicular to each other.

Figure 3:
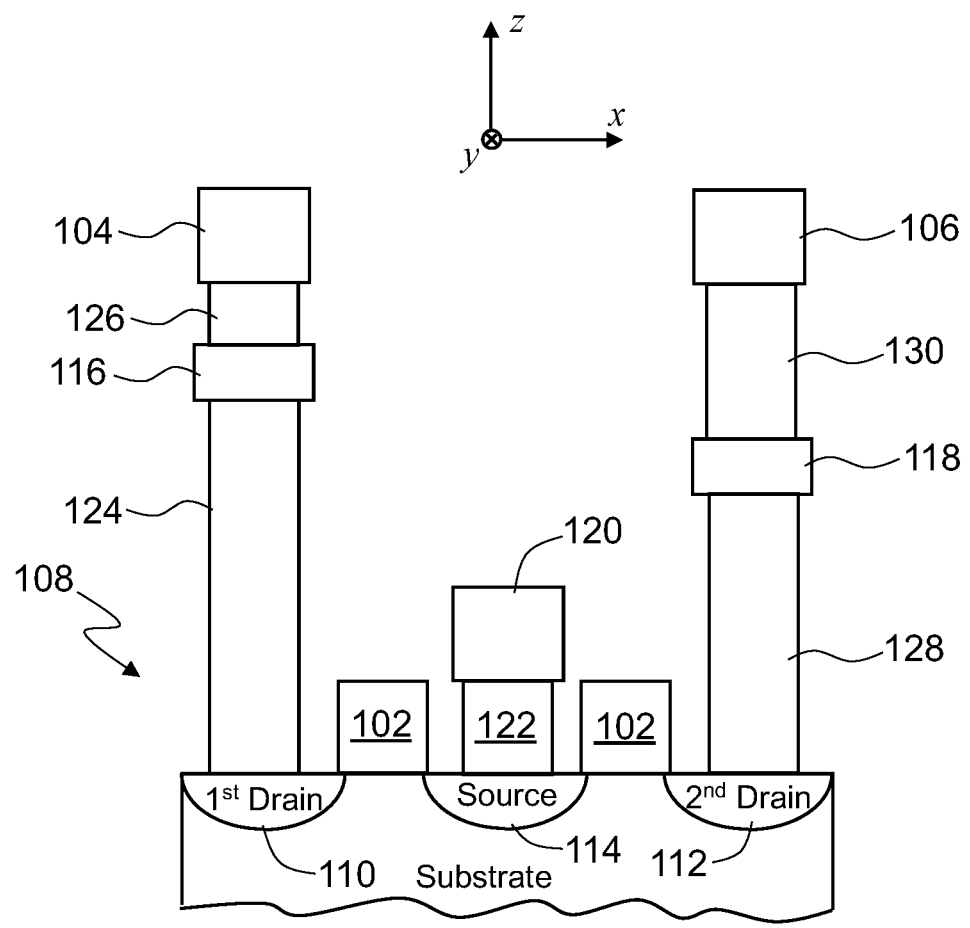
FIG. 3 is a cross-sectional view of an active region and the corresponding structure thereabove for the nonvolatile memory device shown in FIG. 2.

FIG. 3 is a cross-sectional view showing an active region 108 and the structure formed thereon. Each active region 108 includes first and second selection transistors. The first selection transistor may include the first drain 110, the common source 114, and a first conductive line 102 disposed therebetween that may function a the gate for controlling the current flow between the common source 114 and the first drain 110. The second transistor may include the second drain 112, the common source 114, and another first conductive line 102 disposed therebetween that may function as a gate for controlling the current flow between the common source 114 and the second drain 112. Alternatively, the first and second selection transistors may have separate gates (not shown) interposed between the substrate and the first conductive lines 102. A third conductive line 120 may be formed on top of a source contact 122, which may be formed on top of the common source 114 of the first and second selection transistors in the active region 108. Accordingly, the third conductive line 120 may be electrically connected to the common source 114 therebeneath through the source contact 122. A first memory element 116 is electrically connected to the first drain 110 of the first selection transistor through a first drain contact 124 therebeneath and a respective one of the first plurality of second conductive lines 104 through a first via 126 thereabove. A second memory element 118 is electrically connected to the second drain 112 of the second selection transistor through a second drain contact 128 therebeneath and a respective one of the second plurality of second conductive lines 106 through a second via 130 thereabove. The first and second memory elements 116 and 118 are fabricated separately at different levels with respect to the substrate and may have different structures and performance characteristics. The first and second plurality of second conductive lines 104 and 106 may be coplanar and fabricated together.

Compared to the prior art device shown in FIG. 1, the dual memory layers of the present invention shown in FIGS. 2 and 3 can advantageously increase the minimum center-to-center distance between two adjacent memory elements by a factor of √2 for the given cell arrangement, which could ease processing constraints or increase the memory element size for improved memory performance.

Figure 4:
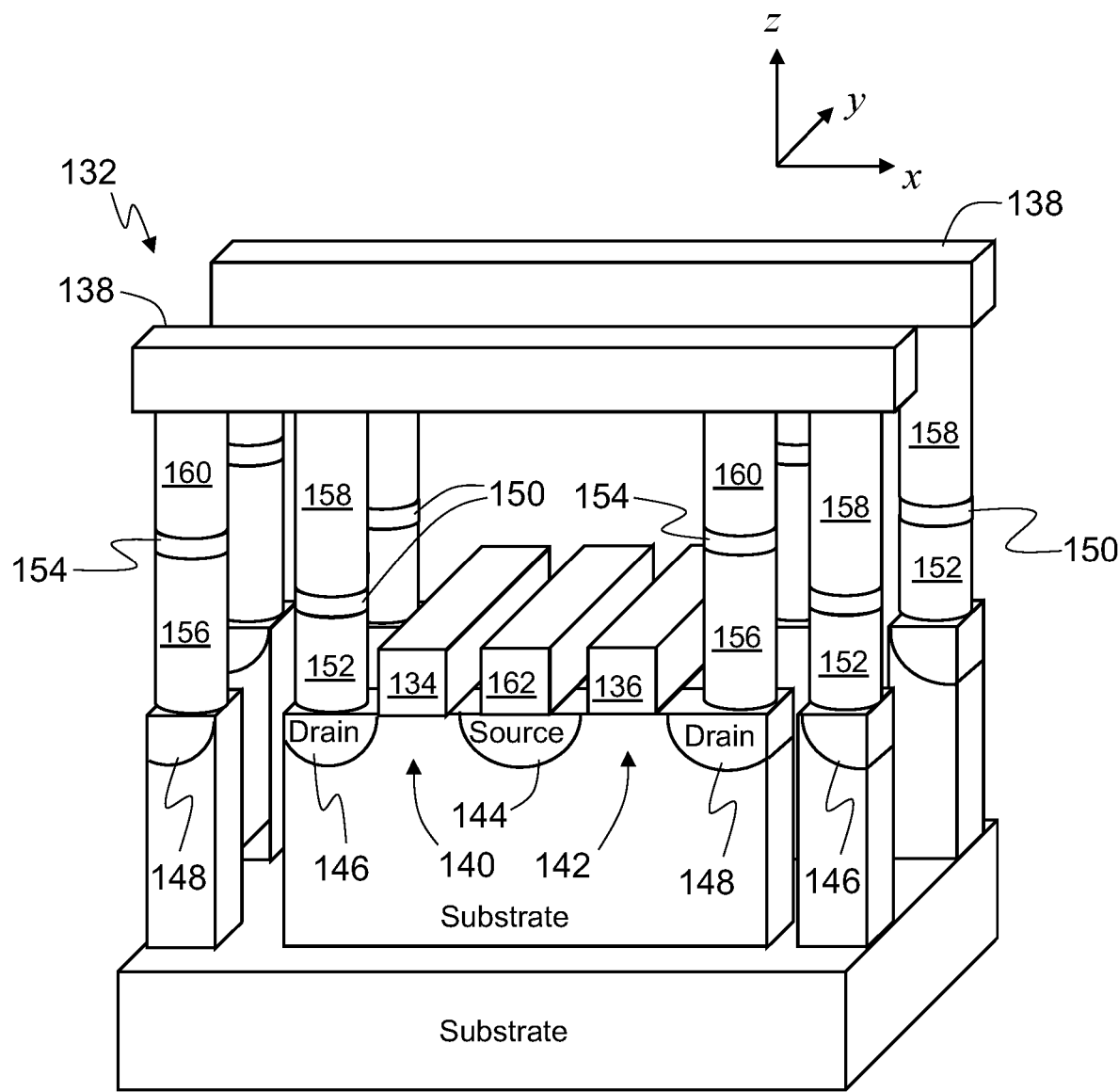
FIG. 4 is a perspective view of a nonvolatile memory device including two layers of memory elements in accordance with another embodiment of the present invention.

The dual memory layers of the present invention can also be extended to other memory cell layout arrangement, such as rectangular array. FIG. 4 is a perspective view of a nonvolatile memory device 132 comprising a first plurality of first conductive lines 134 and a second plurality of first conductive lines 136 extending along a first direction, a plurality of second conductive lines 138 extending along a second direction substantially perpendicular to the first direction, and a plurality of selection transistor pairs arranged in a rectangular array on a substrate. In this drawing, the insulation material separating various elements is omitted for reasons of clarity. Each selection transistor pair includes a first selection transistor 140 and a second selection transistor 142 sharing a common source 144. The first selection transistor 140 includes a first drain 146, the common source 144, and a planar channel (with respect to the substrate surface) formed therebetween. The second selection transistor 142 includes a second drain 148, the common source 144, and another planar channel formed therebetween.

With continued reference to FIG. 4, a first memory element 150 is electrically connected to the first drain 146 therebeneath through a first drain contact 152. A second memory element 154 is electrically connected to the second drain 148 therebeneath through a second drain contact 156. The first and second memory elements 150 and 154 are fabricated separately at different levels with respect to the substrate and may have different structures and performance characteristics. The first and second memory elements 150 and 154 are electrically connected to a respective one of the plurality of the second conductive lines 138 thereabove through first and second vias 158 and 160, respectively.

The nonvolatile memory device 132 further includes a plurality of third conductive lines 162 with each electrically connected to a row of common sources 138 along the first direction. The plurality of third conductive lines 162 may be electrically connected to the common sources 144 through source contacts (not shown). Each of the first plurality of first conductive lines 134 may function as gates for a row of the first selection transistors 140 or be electrically connected to individual gates (not shown) of a row of the first selection transistors 140 along the first direction. Each of the second plurality of first conductive lines 136 may function as gates for a row of the second selection transistors 142 or be electrically connected to individual gates (not shown) of a row of the second selection transistors 142 along the first direction. The first and second plurality of first conductive lines 134 and 136 may be coplanar and fabricated together.

Figure 5:
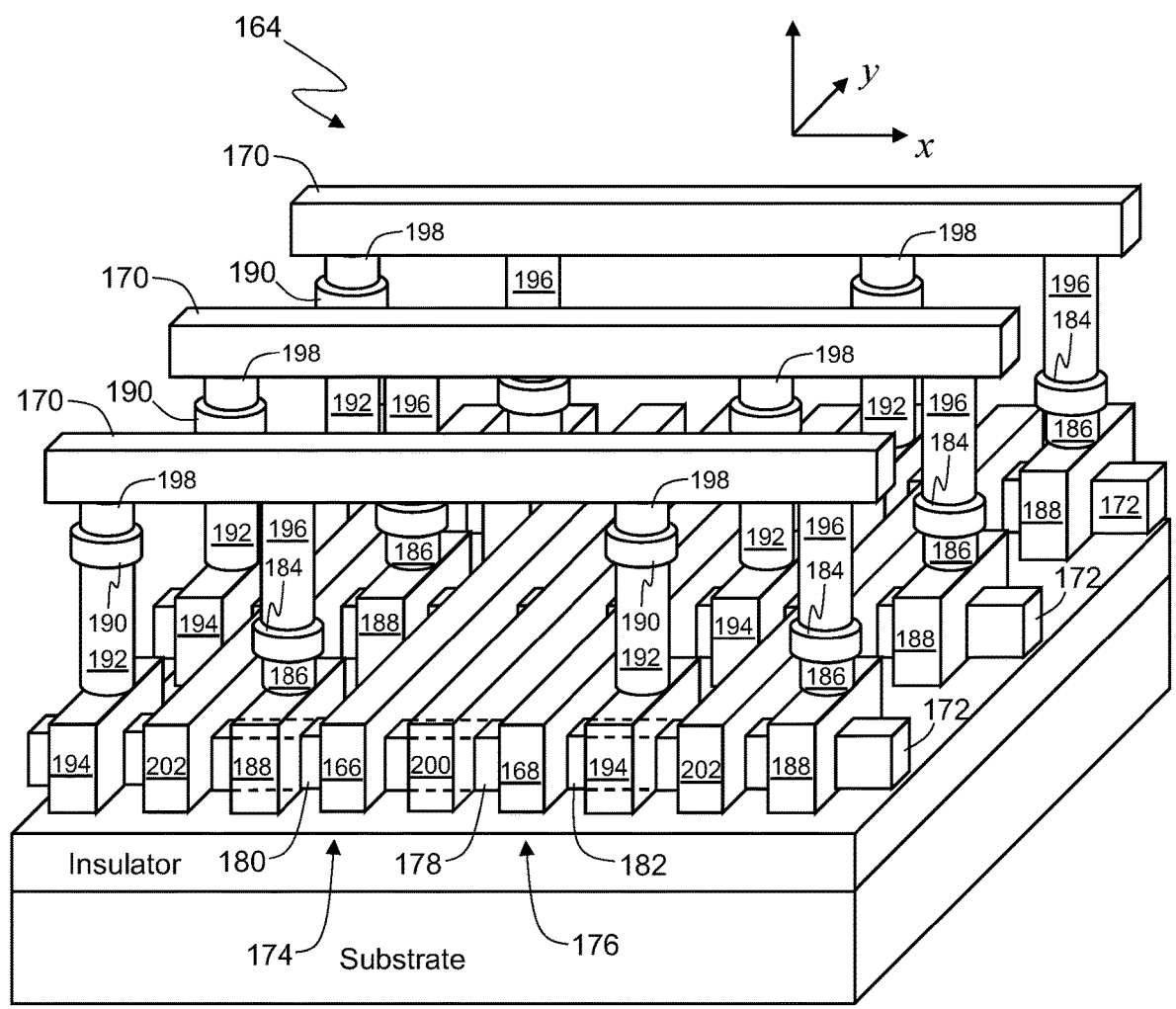
FIG. 5 is a perspective view of a nonvolatile memory device including two layers of memory elements in accordance with still another embodiment of the present invention For purposes of clarity and brevity, like elements and components will bear the same designations and numbering throughout the Figures, which are not necessarily drawn to scale.

The dual memory layers of the present invention can also accommodate other types of transistors, such as fin field-effect transistor (FinFET). FIG. 5 is a perspective view of a nonvolatile memory device 164 comprising a first plurality of first conductive lines 166 and a second plurality of first conductive lines 168 extending along a first direction, a plurality of second conductive lines 170 extending along a second direction substantially perpendicular to the first direction, a plurality of semiconductor fins 172 protruded from a substrate and extending along the second direction, and a plurality of selection transistor pairs arranged in a rectangular array on the substrate. In this drawing, the insulation material separating various elements is omitted for reasons of clarity. Each selection transistor pair includes a first selection transistor 174 and a second selection transistor 176 sharing a common source 178, which is formed on/in a portion of a fin 172. The first selection transistor 174 includes a first drain 180 formed on/in another portion of the fin 172, the common source 178, and at least two vertical channels (with respect to the substrate surface) formed on the surface of the fin 172 surrounded by the first conductive line 166 between the first drain 180 and the common source 178. The second selection transistor 176 includes a second drain 182 formed on/in yet another portion of the fin 172, the common source 178, and at least two vertical channels formed on the surface of the fin 172 surrounded by the first conductive line 168 between the second drain 182 and the common source 178.

With continued reference to FIG. 5, a first memory element 184 may be electrically connected to the first drain 180 of the first selection transistor 174 therebeneath through a first drain contact 186 and a first trench contact 188. A second memory element 190 may be electrically connected to the second drain 182 of the second selection transistor 176 therebeneath through a second drain contact 192 and a second trench contact 194. The first and second memory elements 184 and 190 are fabricated separately at different levels with respect to the substrate and may have different structures and performance characteristics. The first and second memory elements 184 and 190 may be electrically connected to a respective one of the plurality of the second conductive lines 170 thereabove through first and second vias 196 and 198, respectively.

The nonvolatile memory device 164 further includes a plurality of third conductive lines 200 with each electrically connected to a row of common sources 178 along the first direction. The plurality of third conductive lines 200 may alternatively be electrically connected to the common sources 178 through trench contacts (not shown). Each of the first plurality of first conductive lines 166 may function as gates for a row of the first selection transistors 174 along the first direction. Each of the second plurality of first conductive lines 168 may function as gates for a row of the second selection transistors 176 along the first direction. The first and second plurality of first conductive lines 166 and 168 may be coplanar and fabricated together. The nonvolatile memory device 164 may further include a plurality of fourth conductive lines 202 extending along the first direction and operable to electrically isolate adjacent selection transistor pairs sharing a same fin 172 during operation. The application of zero or other suitable voltage to a fourth conductive line 202 may prevent current flow through the fin surface surrounded by the line 202.

It is worth noting that while each selection transistor 174 or 176 of the nonvolatile memory device 164 is shown to form on a single fin 172 in FIG. 5, the present invention can be extended to transistors that incorporate multiple fins, which may further improve the current-carrying capacity. For selection transistors that incorporate multiple fins and have multiple drains, each memory element 184 or 190 may be electrically connected to the multiple drains via a trench contact that is coupled to the multiple drains.

The substrate of the devices shown in FIGS. 3-5 can be any semiconductor substrate known in the art, such as but not limited to Si, SiGe, SiC, SiCGe, II-VI compounds, III-V compounds, or semiconducting epitaxial layers over such substrates. The drain contacts 124/128/152/156/186/192 and the source contact 122 may each comprise one or more suitable conductive materials, such as but not limited to tungsten, aluminum, tantalum, titanium nitride, tantalum nitride, tungsten nitride, tungsten silicide, titanium silicide, cobalt silicide, nickel silicide, and any combinations thereof. The vias 126/130/158/160/196/198 may each comprise one ore more suitable conductive materials, such as but not limited to copper, silver, tungsten, aluminum, tantalum, titanium nitride, tantalum nitride, tungsten nitride, tungsten silicide, titanium silicide, cobalt silicide, nickel silicide, and any combinations thereof. The first conductive lines 102/134/136/166/168, which may function as gate electrodes, may each comprise any suitable conductive material, such as but not limited to doped polysilicon, aluminum, tantalum, niobium, tungsten, tantalum nitride, niobium nitride, tungsten nitride, and any combinations thereof. The second conductive lines 104/106/138/170, which may function as bit lines, may each comprise any suitable conductive material, such as but not limited to copper, tantalum nitride, silver, aluminum, or any combination thereof. The third conductive lines 120/162/200, which may function as source lines, may comprise any suitable conductive material, such as but not limited to tungsten, aluminum, tantalum, niobium, copper, silver, titanium nitride, tantalum nitride, tungsten nitride, niobium nitride, tungsten silicide, titanium silicide, cobalt silicide, nickel silicide, or any combination thereof. The fourth conductive lines 202, which may function as isolation gate electrodes, may comprise any suitable conductive material, such as but not limited to doped polysilicon, aluminum, tantalum, niobium, tungsten, tantalum nitride, niobium nitride, tungsten nitride, and any combinations thereof.

The first memory element 116/150/184 and the second memory element 118/154/190 may switch their resistance states by any suitable switching mechanism, such as phase change, precipitate bridging, magnetoresistive switching, or a combination thereof. In one embodiment, The first memory element 116/150/184 and/or the second memory element 118/154/190 comprise a phase change chalcogenide compound, such as but not limited to Ge2Sb2Te5 or AgIn-SbTe, which can switch between a resistive amorphous phase and a conductive crystalline phase. In another embodiment, the first memory element 116/150/184 and/or the second memory element 118/154/190 comprise a nominally insulating metal oxide material, such as but not limited to $NiO$, $TiO_2$, or $Sr(Zr)TiO_3$, which can switch to a lower electrical resistance state as the metal rich precipitates grow and link to form conductive paths upon application of an appropriate voltage. In yet another embodiment, the first memory element 116/150/184 and/or the second memory element 118/154/190 comprise a magnetic tunnel junction (MTJ) that includes at least two layers of ferromagnetic materials with an insulating tunnel barrier layer interposed therebetween. When a switching pulse is applied, one of the ferromagnetic layers will switch its magnetization direction, thereby changing the element's electrical resistance.

In addition to increasing the minimum center-to-center distance between two adjacent memory elements for easing processing constraints, the dual memory layers of the present invention can also allow a nonvolatile memory device to incorporate two different types of memory elements with different characteristics since they are fabricated separately. For example, the first memory element 116/150/184 may have a high switching speed that is suitable for primary or working memory, while the second memory element 118/154/190 may have a long data retention time that is suitable for data storage, thereby forming a "universal" memory. In one embodiment, the first memory element 116/150/184 and the second memory element 118/154/190 have different structures. In another embodiment, the first memory element 116/150/184 and the second memory element 118/154/190 have different switching mechanisms. In still another embodiment, the first memory element 116/150/184 and the second memory element 118/154/190 are made of magnetic tunnel junctions (MTJs) with different structures.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

What is claimed is:

1. A nonvolatile memory device comprising:
   a plurality of first conductive lines extending along a first direction;
   first and second plurality of second conductive lines extending along a second direction;
   an array of active regions, each active region having an elongated shape directed along a third direction substantially bisecting an angle formed between the first and second directions and including first and second drains formed at opposite ends of each active region along the third direction; and
   an array of first memory elements and an array of second memory elements formed at different levels with respect to the array of active regions, each first memory element and each second memory element being electrically connected to a respective first drain and a respective second drain, respectively,
   wherein the first and second plurality of second conductive lines are electrically connected to the array of first memory elements and the array of second memory elements along the second direction, respectively.

2. The nonvolatile memory device of claim 1, wherein the second direction is substantially perpendicular to the first direction.

3. The nonvolatile memory device of claim 1, wherein each active region includes two of a plurality of selection transistors sharing one of a plurality of common sources formed between the first and second drains.

4. The nonvolatile memory device of claim 3, wherein the plurality of first conductive lines cross the array of active regions and are configured to control current flow in the plurality of selection transistors.

5. The nonvolatile memory device of claim 3, wherein one of the two of the plurality of selection transistors includes the first drain and the other one of the two of the plurality of selection transistors includes the second drain.

6. The nonvolatile memory device of claim 3 further comprising a plurality of third conductive lines electrically connected to the plurality of common sources along the second direction.

7. The nonvolatile memory device of claim 1, wherein the first and second plurality of second conductive lines are coplanar.

8. The nonvolatile memory device of claim 1, wherein the array of first memory elements and the array of second memory elements have different switching mechanisms.

9. The nonvolatile memory device of claim 1, wherein the array of first memory elements and the array of second memory elements comprise magnetic tunnel junctions.

10. The nonvolatile memory device of claim 9, wherein the array of first memory elements and the array of second memory elements have different structures.

\* \* \* \* \*